United States Patent
Abe et al.

(10) Patent No.: US 11,824,070 B2
(45) Date of Patent: Nov. 21, 2023

(54) SILICON SINGLE CRYSTAL SUBSTRATE AND SILICON EPITAXIAL WAFER FOR SOLID-STATE IMAGE SENSOR AND SOLID-STATE IMAGE SENSOR

(71) Applicant: SHIN-ETSU HANDOTAI CO., LTD., Tokyo (JP)

(72) Inventors: Takao Abe, Annaka (JP); Tsuyoshi Ohtsuki, Annaka (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 194 days.

(21) Appl. No.: 17/089,122

(22) Filed: Nov. 4, 2020

(65) Prior Publication Data

US 2021/0159259 A1 May 27, 2021

(30) Foreign Application Priority Data

Nov. 26, 2019 (JP) .................. 2019-213288
Dec. 23, 2019 (JP) .................. 2019-231078

(51) Int. Cl.
*H01L 27/146* (2006.01)
*C30B 29/06* (2006.01)

(52) U.S. Cl.
CPC ........ *H01L 27/14616* (2013.01); *C30B 29/06* (2013.01); *H01L 27/14692* (2013.01); *H01L 27/1462* (2013.01)

(58) Field of Classification Search
None
See application file for complete search history.

(56) References Cited

U.S. PATENT DOCUMENTS

| 6,815,605 B1 | 11/2004 | Abe et al. | |
| 2020/0135786 A1* | 4/2020 | Onuki | H01L 27/14636 |

FOREIGN PATENT DOCUMENTS

| CN | 102400219 A | * | 4/2012 | |
| CN | 102978699 A | * | 3/2013 | |
| EP | 2611952 B1 | * | 12/2021 | .............. C30B 15/00 |
| JP | 3679366 B2 | | 8/2005 | |
| JP | 2019-009212 A | | 1/2019 | |
| JP | 2019-079834 A | | 5/2019 | |
| WO | WO-2014155985 A1 | * | 10/2014 | .............. C30B 15/20 |

OTHER PUBLICATIONS

Kaneda, Tasuku et al., "Analysis of a Residual Image in CMOS Image Sensor 1", The 77th Japan Society of Applied Physics Autumn Meeting, Meeting Proceedings, (2016), 14p-P6-10.
Ohtani, Akira et al., "Analysis of a Residual Image in CMOS Image Sensor 2" The 77th Japan Society of Applied Physics Autumn Meeting, Meeting Proceedings, (2016), 14p-P6-11.

* cited by examiner

*Primary Examiner* — Nilufa Rahim
(74) *Attorney, Agent, or Firm* — Oliff PLC

(57) ABSTRACT

The present invention is a silicon single crystal substrate for a solid-state image sensor obtained by slicing a silicon single crystal fabricated by a CZ method, where the silicon single crystal substrate is a p-type silicon single crystal substrate whose main dopant is Ga, and the silicon single crystal substrate has a B concentration of $5 \times 10^{14}$ atoms/cm$^3$ or less. This provides a silicon single crystal substrate and a silicon epitaxial wafer for a solid-state image sensor that can suppress the residual image characteristics of a solid-state image sensor.

10 Claims, 5 Drawing Sheets

[FIG. 1]
10
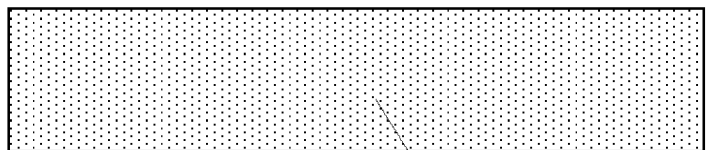
Main dopant: Ga
B concentration: $5 \times 10^{14}$ atoms/cm$^3$ or less

[FIG. 2]
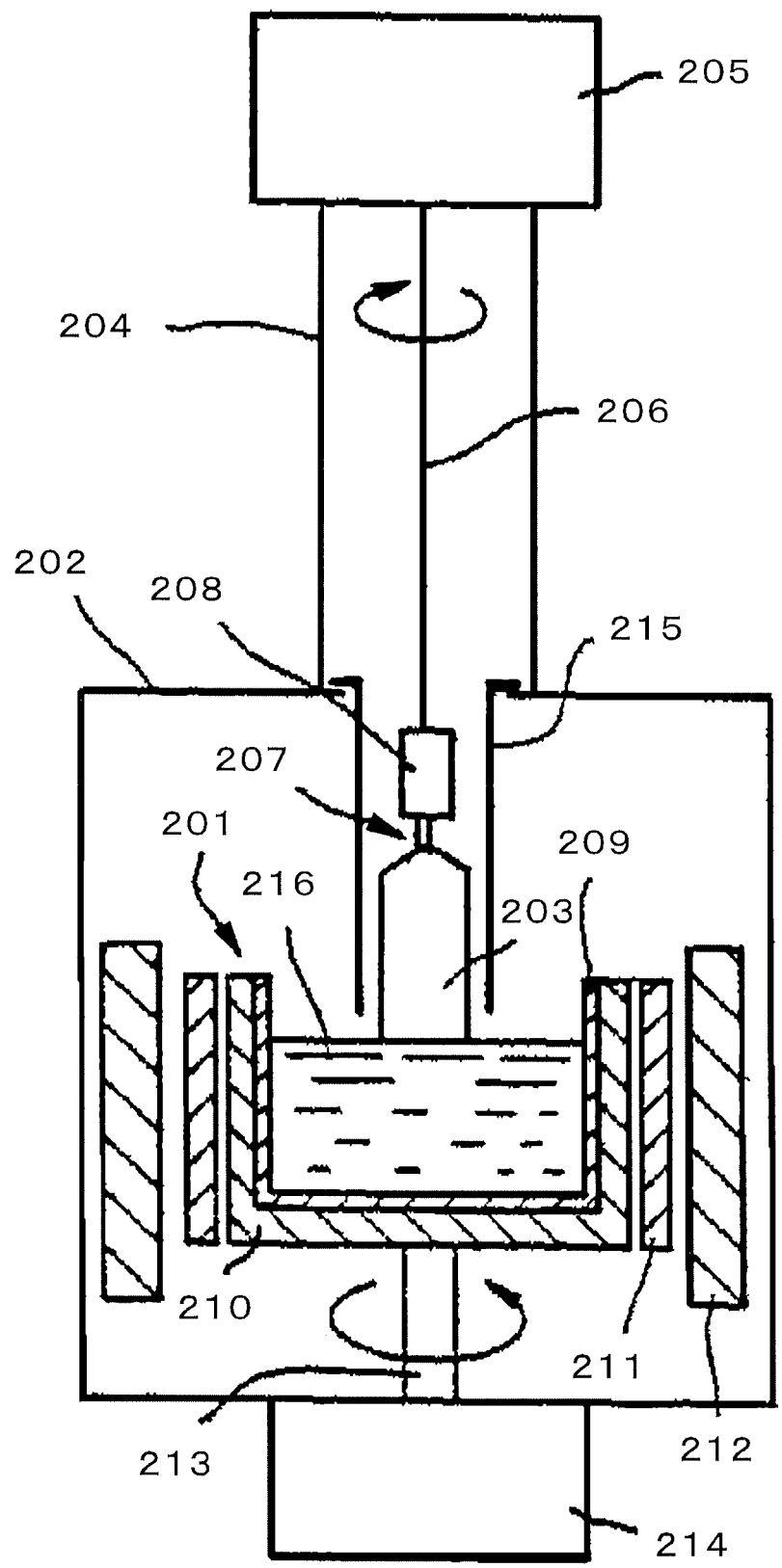

[FIG. 3A]
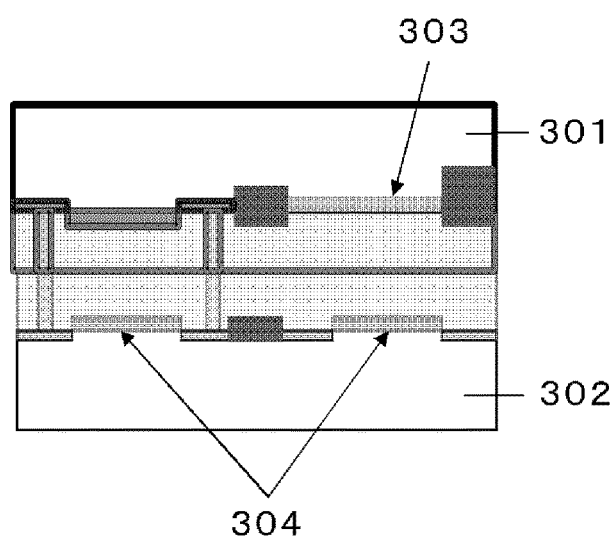
[FIG. 3B]
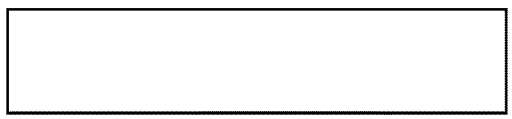
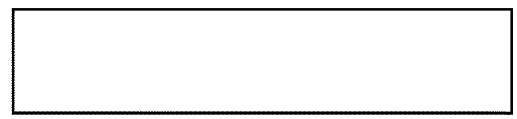
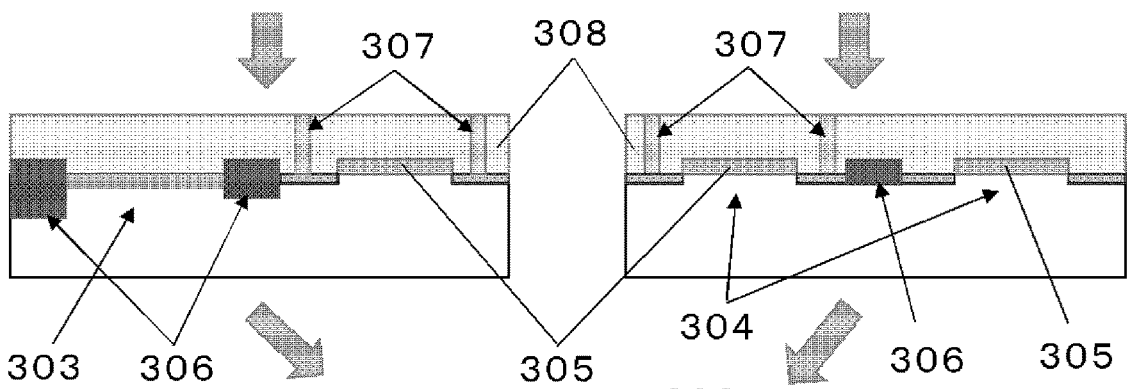
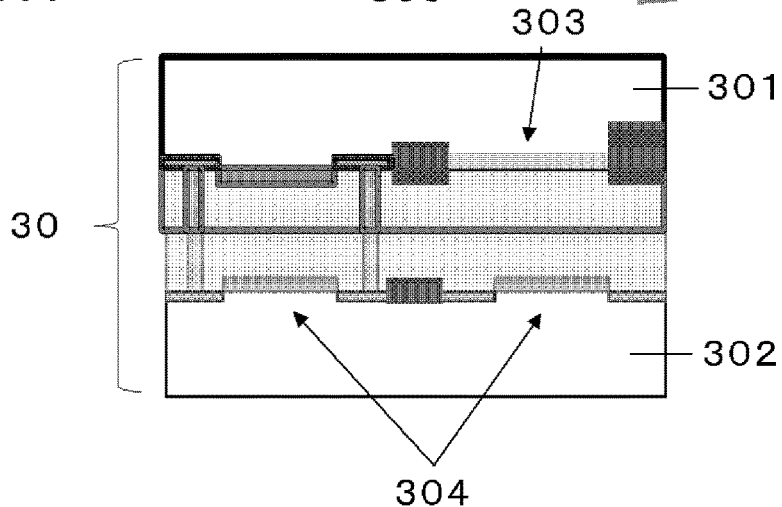

[FIG. 4]
40
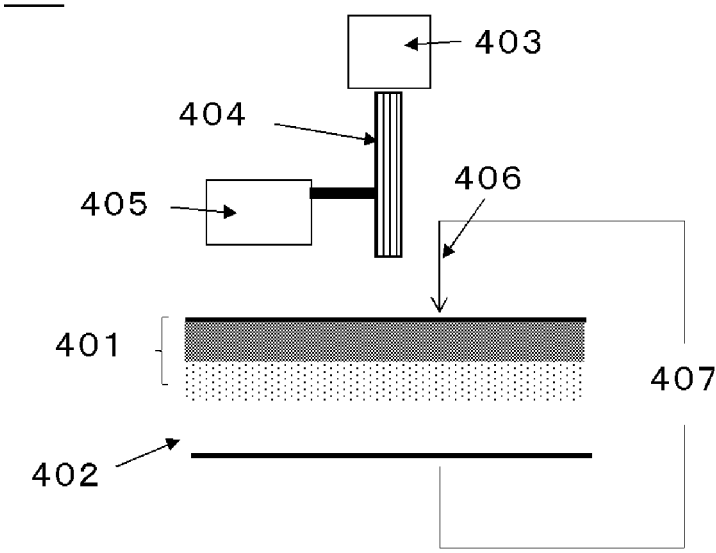
[FIG. 5]
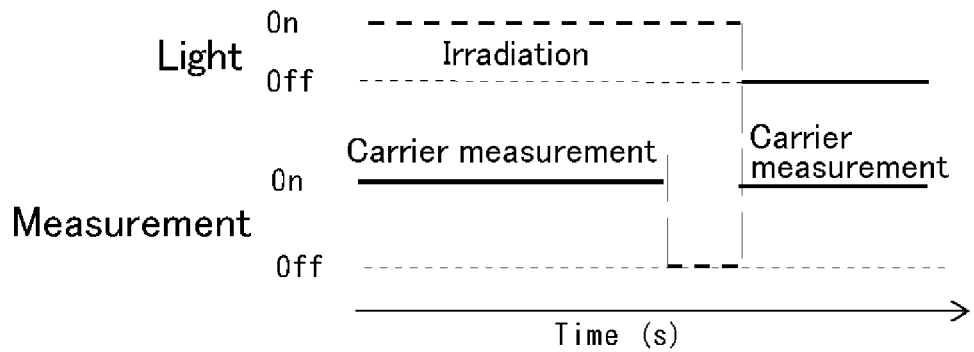
[FIG. 6]
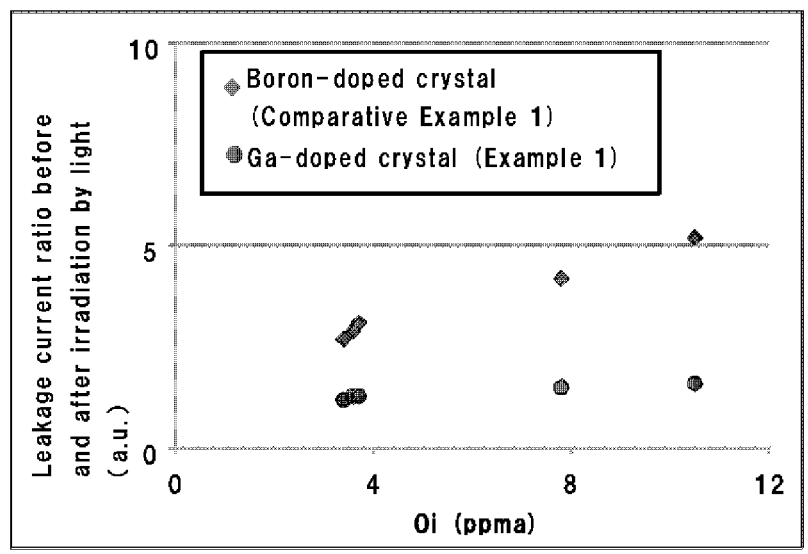

[FIG. 7]
70
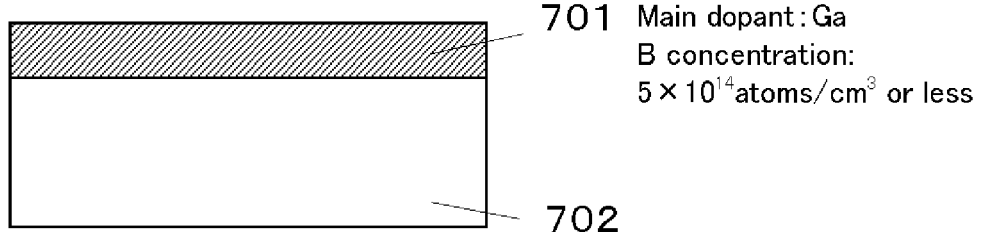
701 Main dopant: Ga
B concentration:
$5 \times 10^{14}$ atoms/cm$^3$ or less
702

SILICON SINGLE CRYSTAL SUBSTRATE AND SILICON EPITAXIAL WAFER FOR SOLID-STATE IMAGE SENSOR AND SOLID-STATE IMAGE SENSOR

TECHNICAL FIELD

The present invention relates to: a silicon single crystal substrate and a silicon epitaxial wafer for a solid-state image sensor; and a solid-state image sensor.

BACKGROUND ART

Solid-state image sensors are used in mobile devices including smartphones. A solid-state image sensor obtains images by capturing carriers generated by light in a depletion layer region (photodiode) of a p-n junction to change optical information to electronic information (photoelectric conversion). In recent years, along with increase in the number of pixels, it has become possible to obtain many images in a short time by mounting a cache memory near the photodiode, and in addition to high image quality, it has become possible to take pictures of the instant that were conventionally difficult to capture. This means reading data from the photodiode in a short time.

In this event, residual image characteristics becomes a problem. This is a phenomenon where carriers that are generated by a photoelectric effect are trapped and then released again after some time has passed so that an image appears to remain by the influence of these carriers. With improvement in performance, this means that when a large amount of data is obtained in a short time, the influence of the former image data remains if this residual image is present. A cause of residual image characteristics is said to be composites of boron and oxygen in a substrate (see Non Patent Documents 1 and 2, and Patent Documents 1 and 2).

In addition, expectations for automatic operation have been growing in recent years, and LiDAR is attracting attention as a sensor (eye) for this purpose. This is a technology of irradiating with an infrared ray as a light source and capturing the reflected light with a sensor to measure the surrounding situation (distance), and has conventionally been used in fields such as aircraft and measurement of mountain regions. It is said that by combining with millimeter waves, a high-precision measurement required in automatic operation becomes possible. A solid-state image sensor is used in the part to be a sensor in this LiDAR system. Here, as a means for raising sensitivity, a method is being considered where an avalanche breakdown of a diode on incidence of one photon into a photodiode is used to raise sensitivity by doubling the amount of generated carriers, for example. In this field also, there is possibility of degradation in precision (sensing light when there is actually no light, or degradation in temporal resolution due to providing a delay time to avoid residual image, etc.) if the aforementioned residual image characteristics occur.

Solid-state image sensors are expected to be used in many fields in addition to the above-described automatic operation such as a visual recognition sensor mounted in an industrial robot or for medical use such as in a surgical operation, for example.

Since these solid-state image sensors containing a photodiode are fabricated using a silicon substrate, development of a substrate that can suppress residual image characteristics is very important.

CITATION LIST

Patent Literature

Patent Document 1: Japanese Unexamined Patent Application Publication No. 2019-9212
Patent Document 2: Japanese Unexamined Patent Application Publication No. 2019-79834
Patent Document 3: Japanese Patent No. 3679366

Non Patent Literature

Non Patent Document 1: The 77th Japan Society of Applied Physics Autumn Meeting, Meeting Proceedings, 14p-P6-10, Tasuku Kaneda, Akira Ohtani, "Analysis of a residual image in CMOS image sensor 1"
Non Patent Document 2: The 77th Japan Society of Applied Physics Autumn Meeting, Meeting Proceedings, 14p-P6-11, Akira Ohtani, Tasuku Kaneda, "Analysis of a residual image in CMOS image sensor 2"

SUMMARY OF INVENTION

Technical Problem

The present invention has been made in view of the above-described problems, and an object thereof is to provide a silicon single crystal substrate and a silicon epitaxial wafer for a solid-state image sensor that can suppress the residual image characteristics of a solid-state image sensor.

Solution to Problem

To achieve the object, the present invention provides a silicon single crystal substrate for a solid-state image sensor obtained by slicing a silicon single crystal fabricated by a CZ method, wherein
the silicon single crystal substrate is a p-type silicon single crystal substrate whose main dopant is Ga, and the silicon single crystal substrate has a B concentration of $5 \times 10^{14}$ atoms/cm$^3$ or less.

In this manner, when the silicon single crystal substrate for a solid-state image sensor is a p-type silicon single crystal substrate obtained by slicing a silicon single crystal fabricated by the CZ (Czochralski) method, and the main dopant of the p-type silicon single crystal substrate is changed from the generally used B (boron) to Ga (gallium), and the B concentration in the substrate is $5 \times 10^{14}$ atoms/cm$^3$ or less, B concentration, which becomes a cause of residual image characteristics, can be lowered. Therefore, residual image characteristics can be suppressed regardless of interstitial oxygen concentration.

Furthermore, since the present invention is a CZ substrate, a substrate more excellent than an FZ (floating zone) substrate in aspects of substrate strength, gettering capability, substrate diameter size, etc. can be achieved.

Note that "main dopant" means the dopant with the greatest concentration that determines the conductivity type of the silicon single crystal substrate.

Furthermore, the p-type silicon single crystal substrate preferably has an interstitial oxygen concentration of 1 ppma or more and 15 ppma or less.

With 15 ppma or less, the probability of the phenomenon (called white flaw or dark current) that electron-hole pairs are produced with oxygen as the generation center in a depletion layer and an electric charge is generated even though there is no incidence of light can be reduced. On the other hand, with 1 ppma or more, problems of substrate strength degradation and insufficient gettering capability regarding heavy-metal contamination can be prevented from occurring with more certainty.

Note that the value of the interstitial oxygen concentration is by JEIDA (JEITA) standard. JEIDA is an abbreviation for Japan Electronic Industry Development Association, and this means that the interstitial oxygen concentration is calculated using a conversion factor determined by JEIDA. Currently, JEIDA has been renamed JEITA (Japan Electronics and Information Technology Industries Association).

Furthermore, the present invention provides a solid-state image sensor having a photodiode unit, a memory unit, and a calculation unit, wherein at least the photodiode unit is formed on the above-described inventive silicon single crystal substrate for a solid-state image sensor.

The solid-state image sensor has at least a photodiode unit, a memory unit, and a calculation unit, but a place where residual image characteristics occur is the photodiode unit. Therefore, by using a p-type silicon single crystal substrate whose main dopant is Ga where the B concentration is $5 \times 10^{14}$ atoms/cm$^3$ or less as at least the substrate on which the photodiode unit is formed, it is possible to fabricate a solid-state image sensor with suppressed residual image characteristics.

Furthermore, the present invention provides a silicon epitaxial wafer for a solid-state image sensor having a silicon epitaxial layer on a surface of a silicon single crystal substrate, wherein the silicon epitaxial layer is a p-type epitaxial layer whose main dopant is Ga, and the silicon epitaxial layer has a B concentration of $5 \times 10^{14}$ atoms/cm$^3$ or less.

When a solid-state image sensor is fabricated using a silicon epitaxial wafer, it is expected that composites of B and oxygen that cause residual image characteristics do not form even if the main dopant of the epitaxial layer is B as is conventional, since hardly any oxygen is contained in the silicon epitaxial layer (also simply referred to as epitaxial layer) on which the photodiode is formed. However, in conventional products, oxygen in the silicon single crystal substrate diffuses to the epitaxial layer and residual image characteristics occur in some cases due to deposition of the epitaxial layer or a heat treatment in a device fabrication process. However, in the present invention, the main dopant of the epitaxial layer is Ga and the B concentration is $5 \times 10^{14}$ atoms/cm$^3$ or less, and therefore, residual image characteristics can be suppressed regardless of oxygen diffusion from the substrate. Furthermore, even when B is also contained in the silicon single crystal substrate and the B is also diffused to the epitaxial layer, the B concentration in the epitaxial layer is originally extremely low as described above, and therefore, residual image characteristics can still be suppressed.

Furthermore, the silicon single crystal substrate can be a p-type silicon single crystal substrate whose main dopant is Ga, and the silicon single crystal substrate can have a B concentration of $5 \times 10^{14}$ atoms/cm$^3$ or less.

When B and oxygen are contained in the silicon single crystal substrate on which the epitaxial layer is formed, both elements diffuse to the epitaxial layer and residual image characteristics occur in some cases in conventional products depending on the concentrations of the elements and the heat treatment performed on the silicon single crystal substrate. Accordingly, when the main dopant of the silicon single crystal substrate is Ga, and the B concentration is $5 \times 10^{14}$ atoms/cm$^3$ or less, residual image characteristics can be suppressed more certainly.

Furthermore, the silicon single crystal substrate can be a $p^+$-type silicon single crystal substrate whose main dopant is B where a B concentration is $1 \times 10^{18}$ atoms/cm$^3$ or more.

Such a $p^+$-type silicon single crystal substrate makes it possible to further raise the gettering capability of metal impurities, etc. that may be generated due to deposition of the epitaxial layer or a heat treatment in a device fabrication process. In this case, there is danger of B diffusing from the $p^+$-type silicon single crystal substrate to the epitaxial layer, but since there is almost no oxygen contained in the epitaxial layer as described above, formation of composites of B and oxygen that become the cause of residual image characteristics can be suppressed.

Furthermore, the silicon single crystal substrate can be a $p^-$-type silicon single crystal substrate whose main dopant is B where a B concentration is $1 \times 10^{16}$ atoms/cm$^3$ or less.

With such a $p^-$-type, B that diffuses to the epitaxial layer due to deposition of the epitaxial layer or a heat treatment in a device fabrication process is limited, and therefore, it is possible to suppress the formation of composites of B and oxygen in the epitaxial layer, and raise gettering capability and substrate strength by raising the interstitial oxygen concentration in the silicon single crystal substrate.

Furthermore, the silicon single crystal substrate can be an n-type silicon single crystal substrate.

An n-type silicon single crystal substrate contains almost no B, and therefore, residual image characteristics can be suppressed regardless of diffusion of oxygen from the substrate.

With an n-type silicon single crystal substrate, it is possible to suppress the formation of composites of B and oxygen in the epitaxial layer, and raise gettering capability and substrate strength by raising the interstitial oxygen concentration in the silicon single crystal substrate as in the case with the $p^-$-type silicon single crystal substrate.

Furthermore, the present invention provides a solid-state image sensor having a photodiode unit, a memory unit, and a calculation unit, wherein at least the photodiode unit is formed on the silicon epitaxial layer of the above-described inventive silicon epitaxial wafer for a solid-state image sensor.

The solid-state image sensor has at least a photodiode unit, a memory unit, and a calculation unit, but a place where residual image characteristics occur is the photodiode unit. Therefore, by using a p-type epitaxial layer whose main dopant is Ga where the B concentration is $5 \times 10^{14}$ atoms/cm$^3$ or less as at least the epitaxial layer on which the photodiode unit is formed, it is possible to fabricate a solid-state image sensor with suppressed residual image characteristics.

Advantageous Effects of Invention

As described above, according to the present invention, a silicon single crystal substrate for a solid-state image sensor and a solid-state image sensor by which the residual image characteristics of a solid-state image sensor can be suppressed can be provided. In addition, a silicon epitaxial wafer for a solid-state image sensor and a solid-state image sensor by which the residual image characteristics of a solid-state image sensor can be suppressed can be provided.

BRIEF DESCRIPTION OF DRAWINGS

FIG. 1 is a schematic view showing an example of the inventive silicon single crystal substrate for a solid-state image sensor.

FIG. 2 is a schematic view showing an example of a single crystal pulling apparatus in a CZ method.

FIG. 3A is a schematic view showing an example of the inventive solid-state image sensor.

FIG. 3B is a schematic view showing an example of a method for producing the inventive solid-state image sensor.

FIG. 4 is a block diagram showing an example of residual image characteristics evaluation apparatus.

FIG. 5 is a diagram showing an example of a measurement sequence of a method for evaluating a semiconductor substrate.

FIG. 6 is a graph showing the evaluation results of residual image characteristics in Example 1 and Comparative Example 1.

FIG. 7 is a schematic view showing an example of the inventive silicon epitaxial wafer for a solid-state image sensor.

DESCRIPTION OF EMBODIMENTS

The present inventors have earnestly studied suppressing the residual image characteristics of a solid-state image sensor, and particularly focused their attention on composites of B and oxygen that are said to be related with residual image characteristics. To reduce the composites, the present inventors have conceived using Ga instead of B as a main dopant of a p-type.

Incidentally, an example of using Ga instead of B as a p-type dopant is known to be used in a silicon single crystal for a solar cell (Patent Document 3).

However, solar cells and solid-state image sensors differ in production process and manufacturer, and can be said to be in different technical fields.

In addition, in use for a solar cell, an object is to obtain an effect of suppressing photo-degradation, whereas in use for a solid-state image sensor, an object is to obtain the effect of suppressing residual image characteristics, and therefore, the objective effect is also completely different.

Accordingly, there have never been an example of using a p-type silicon single crystal substrate having a main dopant of Ga as a silicon single crystal substrate for a solid-state image sensor, and such a concept did not even exist.

In addition, if the formation of composites of B and oxygen, said to have a connection with residual image characteristics, is to be suppressed, it is possible to consider using an FZ substrate (a silicon single crystal substrate obtained by slicing from a silicon single crystal that is fabricated by an FZ method and contains almost no oxygen) with the aim of reducing oxygen concentration.

However, an FZ substrate has rarely been used for a solid-state image sensor because of the following faults or the like that exist when an FZ substrate is used for a solid-state image sensor. 1) Substrate strength is low since almost no oxygen is contained, and gettering capability attributable to oxide precipitates cannot be obtained either. 2) Since nitrogen is doped to increase substrate strength, resistivity changes due to generation of nitrogen donors, and the width of a depletion layer in a photodiode unit changes and affects device characteristics. 3) The diameter is one generation smaller than CZ substrates (the current maximum diameter on a mass production level is 300 mm in CZ substrates and 200 mm in FZ substrates).

Accordingly, the present inventors have found out that a p-type CZ silicon single crystal substrate whose main dopant is Ga where a B concentration has a low value of $5\times10^{14}$ atoms/cm$^3$ or less allows favorable residual image characteristics of a solid-state image sensor and substrate strength, etc., and completed the present invention. The present inventors have also found out that a silicon epitaxial wafer having a silicon epitaxial layer that is similar concerning Ga and B allows favorable residual image characteristics of a solid-state image sensor, and completed the present invention.

Hereinafter, the present invention will be described in detail as an example of an embodiment with reference to the drawings, but the present invention is not limited thereto.

A schematic view of the silicon single crystal substrate for a solid-state image sensor in the present invention is shown in FIG. 1. As shown in FIG. 1 the inventive silicon single crystal substrate 10 is a p-type CZ silicon single crystal substrate whose main dopant is Ga, and the silicon single crystal substrate 10 has a B concentration of $5\times10^{14}$ atoms/cm$^3$ or less.

Firstly, being a silicon single crystal substrate fabricated by a CZ method, there are advantages such as having higher substrate strength than an FZ silicon single crystal substrate that contains almost no oxygen, making it possible to obtain gettering capability attributable to oxide precipitates, and having a substrate diameter that is larger by one generation, for example. Note that the substrate diameter is not particularly limited, but can be, for example, 300 mm or more, and further, 450 mm or more.

Furthermore, the main dopant, that is, the dopant that determines the conductivity type of the substrate, is not B, which is doped in a conventional silicon single crystal substrate for a solid-state image sensor, but Ga. In addition, the B concentration is the low value of $5\times10^{14}$ atoms/cm$^3$ or less. For this reason, it is possible to suppress residual image characteristics caused by $BO_2$ composites that have been a problem when producing a solid-state image sensor in conventional products where the main dopant is B. In addition, it is possible to achieve a silicon single crystal substrate that can provide a solid-state image sensor having a more excellent quality than has been conventional concerning residual image characteristics regardless of interstitial oxygen concentration.

The Ga concentration is not particularly limited, and can be appropriately determined according to the desired resistivity, etc.

In addition, the lower limit of the B concentration is not particularly limited. B may be unavoidably mixed when producing a single crystal, but to prevent generation of the above-described $BO_2$ composites, the less, the better.

Note that, regarding dopants, it is sufficient to fulfil the above conditions, and dopants other than Ga and B may be mixed.

Furthermore, the oxygen concentration of the silicon single crystal substrate 10 may be, for example, 1 ppma or more and 15 ppma or less.

When the oxygen concentration is 15 ppma or less, the probability of white flaw (or dark current) where electron-hole pairs are produced with oxygen as the generation center in a depletion layer and an electric charge is generated even though there is no incidence of light can be reduced.

In addition, when the oxygen concentration is 1 ppma or more, problems of substrate strength degradation and insufficient gettering capability regarding heavy-metal contamination can be prevented from occurring with more certainty.

Note that 10 ppma or less is more preferable, and 5 ppma or less is further preferable.

An example of a method for producing such an inventive silicon single crystal substrate 10 will be described in detail hereinafter. Firstly, a constitution example of a single crystal pulling apparatus by the CZ method is shown with reference to FIG. 2.

The single crystal pulling apparatus 20 is constituted from a bottom chamber 202 for housing a crucible 201 for melting raw materials and a top chamber 204 for housing and taking out a pulled single crystal (single crystal ingot) 203. In addition, a wire winding mechanism 205 for pulling a single crystal is provided at the top of the top chamber 204, and performs operations of lifting or lowering the wire 206 in accordance with the growth of the single crystal. In addition, a seed crystal 207 is attached to a seed holder 208 at the tip of the wire 206 to pull the silicon single crystal.

Meanwhile, the crucible 201 in the bottom chamber 202 has the inside constituted from a quartz crucible 209 and the outside from a graphite crucible 210. Around this crucible 201, a heater 211 for melting a polycrystalline silicon raw material charged into the crucible is disposed, and the heater is further surrounded by a thermal insulator 212. The inside of the crucible 201 is filled with silicon melt 216 melted by heating with the heater. In addition, the crucible 201 is supported by a supporting shaft 213 that can rotate or move up and down, and a drive unit 214 for this purpose is attached at the bottom of the bottom chamber 202. In addition, a gas flow-guide cylinder 215 for flow-guide of an inert gas introduced into the furnace can be used.

Next, a method for producing a silicon single crystal using the above-described apparatus will be described. First of all, a polycrystalline silicon raw material and a dopant of Ga are introduced into the crucible 201 and heated by the heater 211 to melt the raw materials. In the present embodiment, the Ga was introduced into the crucible with the polycrystalline silicon raw material before melting. However, in mass production, fine concentration adjustment is necessary, and therefore, it is desirable to fabricate a silicon single crystal doped with a high concentration of Ga, break this into fine pieces to make a dopant, and introduce this after melting the polycrystalline silicon raw material, controlling to a desired concentration.

Next, when all the polycrystalline silicon raw material has melted, a seed crystal 207 for growing a single crystal ingot is attached at the tip of the wire 206 of the wire winding mechanism 205, and the wire 206 is gently lowered so that the tip of the seed crystal 207 comes into contact with the silicon melt 216. In this event, the crucible 201 and the seed crystal 207 are rotating in opposite directions to each other. In addition, the inside of the pulling apparatus is under reduced pressure, and is filled with an inert gas such as argon, for example, that flows in from the top of the furnace.

When the temperature around the seed crystal 207 has become stable, the wire 206 is taken up gently while rotating the seed crystal 207 and the crucible 201 in opposite directions to each other, and pulling of the seed crystal 207 is started. Then, necking is performed to annihilate slip dislocation that has occurred in the seed crystal 207. When necking has been performed up to the thickness and length for annihilating slip dislocation, the diameter is gradually increased to fabricate the cone of the single crystal 203 and the diameter is increased to a desired diameter. When the cone diameter has increased to a predetermined diameter, the process moves on to fabrication of the fixed diameter portion (straight body portion) of the single crystal ingot. At this time, the rotational rate of the crucible, pulling rate, the inert gas pressure inside the chamber, flow rate, etc. are appropriately adjusted according to the concentration of the oxygen contained in the single crystal to be grown. Furthermore, crystal diameter is controlled by adjusting the temperature and the pulling rate.

When the straight body portion of the single crystal has been pulled to a predetermined length, the crystal diameter is decreased this time to fabricate a tail, and then, the tip of the tail is detached from the surface of the silicon melt, and the grown silicon single crystal is lifted to the top chamber 204 to wait for the crystal to cool down. When the single crystal ingot has cooled to a temperature at which it can be taken out, the ingot is taken out of the pulling apparatus and proceeds to a step of processing the crystal into a wafer.

In the processing step, firstly, the cone and the tail are cut off, and the perimeter of the single crystal ingot is cylindrical grinding and cut into blocks of an appropriate size. Next, the single crystal blocks made into an appropriate size are sliced into wafers by a slicer, then chamfering, lapping, etc. are performed as necessary, and furthermore, processing distortion is eliminated by etching to fabricate a wafer to be a substrate.

In the above example, an example where only Ga is doped intentionally was given, but the dopant is not limited thereto. It is sufficient for Ga to be doped as the main dopant that determines the conductivity type and the B concentration to be $5\times10^{14}$ atoms/cm$^3$ or less.

This can be appropriately determined according to the desired resistivity, etc.

Resistivity for use as a solid-state image sensor is preferably within the range of 0.1 to 20 Ωcm, for example.

FIG. 3A shows an example of the inventive solid-state image sensor. Here, a back illuminated solid-state image sensor is given as an example, but the present invention is not limited thereto.

A solid-state image sensor 30 has a photodiode unit 303, a memory unit, and a calculation unit 304. The solid-state image sensor 30 is obtained by forming each unit on each of a first substrate 301 (the inventive silicon single crystal substrate 10) and a second substrate 302 and bonding together.

The first substrate, that is, the substrate on which the photodiode unit 303 is formed is a p-type CZ silicon single crystal substrate whose main dopant is Ga and whose B concentration is $5\times10^{14}$ atoms/cm$^3$ or less, as in the inventive silicon single crystal substrate 10.

On the other hand, the second substrate can be, for example, a CZ silicon single crystal substrate. The main dopant does not have to be Ga as in the first substrate, and can be appropriately determined.

Such a solid-state image sensor 30 can be a solid-state image sensor with suppressed residual image characteristics by using a p-type CZ silicon single crystal substrate whose main dopant is Ga where the B concentration is $5\times10^{14}$ atoms/cm$^3$ or less as at least the first substrate 301, since residual image characteristics occur in the photodiode unit 303.

An example of a method for producing such a solid-state image sensor 30 is shown in FIG. 3B.

Firstly, a first substrate 301, which is the inventive substrate, and a second substrate 302 are prepared.

On these substrates, a gate oxide film 305 or the like is formed to form each unit (photodiode unit 303 (light-receiving element), memory unit, and calculation unit 304), and in addition, STI (element isolation) 306, wiring 307, interlayer insulating film 308, etc. are formed.

Subsequently, the first substrate 301 and the second substrate 302 with each unit formed are bonded to fabricate the solid-state image sensor 30.

In addition, a solid-state image sensor using a silicon epitaxial wafer that can suppress residual image characteristics that is a different embodiment to the solid-state image sensor using a silicon single crystal substrate described above is described below.

Firstly, a schematic view of the inventive silicon epitaxial wafer for a solid-state image sensor is shown in FIG. 7. As shown in FIG. 7, the inventive silicon epitaxial wafer 70 has, on the surface of a silicon single crystal substrate 702, a p-type silicon epitaxial layer 701 whose main dopant is Ga where the B concentration is $5\times10^{14}$ atoms/cm$^3$ or less. Such a wafer originally has an extremely low concentration of B in the silicon epitaxial layer 701, and almost no oxygen is contained, and therefore, even if oxygen or B is diffused from the silicon single crystal substrate 702, formation of composites of oxygen and B is suppressed, and residual image characteristics can be suppressed.

Furthermore, the silicon single crystal substrate 702 itself (for example, main dopant, etc.) is not limited, and can be appropriately determined. Examples of the silicon single crystal substrate 702 include the following.

The silicon single crystal substrate 702 can be, for example, a p-type silicon single crystal substrate whose main dopant is Ga where the B concentration is $5\times10^{14}$ atoms/cm$^3$ or less. Such a p-type silicon single crystal substrate makes it possible to more certainly suppress residual image characteristics from occurring by B and oxygen diffusing to the silicon epitaxial layer 701 by a heat treatment performed on the silicon single crystal substrate.

The silicon single crystal substrate 702 can also be, for example, a p$^+$-type silicon single crystal substrate whose main dopant is B where the B concentration is $1\times10^{18}$ atoms/cm$^3$ or more. Such a p$^+$-type silicon single crystal substrate makes it possible to further raise the gettering capability of metal impurities, etc. that may be generated due to deposition of the silicon epitaxial layer 701 or a heat treatment in a device fabrication process. In this case, there is danger of B diffusing from the p$^+$-type silicon single crystal substrate to the epitaxial layer, but since hardly any oxygen is contained in the epitaxial layer, formation of composites of B and oxygen that become the cause of residual image characteristics can be suppressed. The higher limit of the B concentration is not particularly limited, the more, the better, but can be, for example, to solid solubility limit of B to silicon single crystal.

In this event, the interstitial oxygen concentration of this p$^+$-type silicon single crystal substrate is not particularly limited. However, to prevent the diffusion of oxygen from the p$^+$-type silicon single crystal substrate to the epitaxial layer more certainly, the interstitial oxygen concentration is preferably 20 ppma or less, and more preferably 15 ppma or less.

The silicon single crystal substrate 702 can also be, for example, a p$^-$-type silicon single crystal substrate whose main dopant is B where the B concentration is $1\times10^{16}$ atoms/cm$^3$ or less. With such a p$^-$-type silicon single crystal substrate, B that diffuses to the epitaxial layer due to deposition of the epitaxial layer or a heat treatment in a device fabrication process is limited, and therefore, it is possible to more certainly suppress the formation of composites of B and oxygen in the epitaxial layer and raise gettering capability and substrate strength by raising the interstitial oxygen concentration in the silicon single crystal substrate. The lower limit of the B concentration is not particularly limited, the less, the more suppress the formation of composites of B and oxygen.

The silicon single crystal substrate 702 can also be, for example, an n-type silicon single crystal substrate. With an n-type silicon single crystal substrate, hardly any B is contained, and therefore, it is possible to more certainly suppress the formation of composites of B and oxygen in the epitaxial layer, and raise gettering capability and substrate strength by raising the interstitial oxygen concentration in the silicon single crystal substrate as in the case with the p$^-$-type silicon single crystal substrate.

A method for producing such an inventive silicon epitaxial wafer will be described.

Firstly, a silicon single crystal substrate 702 can be obtained by producing using the single crystal pulling apparatus 20 of the CZ method shown in FIG. 2, slicing, and chamfering, etc., for example. Note that when B is to be doped intentionally, a B dopant can be melted together with the raw material when pulling the single crystal in an amount for achieving the desired concentration.

Next, a silicon epitaxial layer 701 is deposited on the produced silicon single crystal substrate 702. In this case, the epitaxial apparatus to use is not particularly limited, and for example, an apparatus similar to a conventional one can be used. The silicon single crystal substrate 702 is disposed on the susceptor inside the furnace, and the furnace is heated. At the same time, trichlorosilane or the like is made to flow into the furnace as a carrier gas and a raw material gas, while a gas containing gallium chloride, for example, is also made to flow in for Ga doping. In this manner, it is possible to deposit an epitaxial layer 701 which is a p-type with a main dopant of Ga, and that can also suppress the B concentration to $5\times10^{14}$ atoms/cm$^3$ or less (the less, the better) even if B is unavoidably mixed, and the inventive silicon epitaxial wafer 70 can be produced.

Note that the method for doping Ga is not limited to the above, and can be appropriately determined according to the desired concentration, etc.

Next, a solid-state image sensor using such a silicon epitaxial wafer will be described, but the present invention is not limited thereto.

The solid-state image sensor has a photodiode unit, a memory unit, and a calculation unit in the same manner as the solid-state image sensor 30 that uses a silicon single crystal substrate shown in FIG. 3A described above. Note that in the example in FIG. 3A, the first substrate 301 on which the photodiode unit 303 is formed is the inventive silicon single crystal substrate 10, but here, this has been replaced by the above-described silicon epitaxial wafer 70.

In the silicon epitaxial layer, on which the photodiode unit is formed, at least the main dopant of the silicon epitaxial layer is Ga and the B concentration is $5\times10^{14}$ atoms/cm$^3$ or less, and a solid-state image sensor having a more excellent quality than is conventional regarding residual image characteristics can be achieved.

EXAMPLE

Hereinafter, the present invention will be described more specifically with reference to Examples and Comparative Examples, but the present invention is not limited thereto.

Example 1

Using the apparatus in FIG. 2, a CZ silicon single crystal was pulled, and then sliced to fabricate a p-type silicon single crystal substrate for a solid-state image sensor of the present invention having a main dopant of Ga. On fabrication, the specific parameters were as follows. Note that the Ga was doped intentionally, but the B is considered to have been mixed unavoidably.

Diameter: 300 mm, crystal orientation: <100>, oxygen concentration: 3.4 to 10.5 ppma, resistivity: 5 Ωcm, Ga concentration: $3 \times 10^{15}$ atoms/cm$^3$, B concentration: $5 \times 10^{13}$ atoms/cm$^3$ or less (the lower limit value in SIMS or less)

Comparative Example 1

A conventional p-type silicon single crystal substrate for a solid-state image sensor having a main dopant of B was fabricated. On fabrication, the specific parameters were as follows. In other respects, the substrate was fabricated in the same manner as in Example 1.

Diameter: 300 mm, crystal orientation: <100>, oxygen concentration: 3.4 to 10.5 ppma, resistivity: 10 Ωcm, B concentration: $1 \times 10^{15}$ atoms/cm$^3$ A p-n junction was formed using the substrates of Example 1 and Comparative Example 1, and the oxygen concentration dependence of residual image characteristics was compared on a substrate level (the oxygen concentration dependence was evaluated by the "leakage current ratio before and after irradiation by light" after annealing at 450° C. for 75 hours). The evaluation apparatus and method are described in detail below.

To explain the specific method for evaluation, an example of a residual image characteristics evaluation apparatus 40 is shown in FIG. 4. The evaluation apparatus is constituted from an equipment (illumination) 403 for performing light irradiation on a semiconductor substrate 402 having a p-n junction structure 401, an optical fiber 404, an equipment (illuminometer) 405 for measuring the quantity of light, and a current measuring instrument (SMU) 407 provided with a Kelvin probe 406. The substrate is then mounted, and after performing a light irradiation on the surface of the semiconductor substrate 402 at a predetermined illuminance for a predetermined time (a step of performing light irradiation), a step of measuring the amount of generated carriers after the light irradiation after turning off the light irradiation is performed.

Here, a white light LED was used for the light irradiation. In addition, the quantity of light at the time of measurement was 500 lux, and the time of light irradiation was 10 seconds.

The amount of generated carriers in the p-n junction formed in this manner was measured. A conceptual diagram of the specific timings of the light irradiation and measurement is shown in FIG. 5. FIG. 5 is a diagram showing an example of a measurement sequence of a method for evaluating a semiconductor substrate.

The generated amount of carriers owing to light irradiation is affected by the kind of semiconductor substrate 402 or a light element contained in the semiconductor substrate 402, particularly carbon. For this reason, to avoid the original difference in the amount of generated carriers owing to light irradiation affecting the residual image characteristics, the generated amount of carriers (the generated amount of carriers during light irradiation) was once measured while performing the light irradiation as shown in FIG. 5. In this manner, the semiconductor substrate was evaluated taking the original difference in the generated amount of carriers into consideration.

In addition, the measurement time for the generated amount of carriers after turning off the light irradiation after the light irradiation was set to 1 second.

Furthermore, in FIG. 5, the reason for stopping the measurement once before measuring the generated amount of carriers after turning off the light irradiation is to avoid a noise with more certainty when the light irradiation is turned off.

The residual image characteristics were then evaluated from the ratio of the current value of the carrier measuring probe when the light irradiation is on and off. For example, if the current value after turning off the light irradiation is high, it means that that many carriers are trapped, and it can be conjectured that the residual image characteristics are poor.

In examples of actual solid-state image sensors, an electric charge is generated by electron-hole pairs that are produced by incident light when a shutter is open, and an image is constructed by taking this in. After the shutter has shut, it is important for the electron-hole pairs to be quickly discharged, and if this is slow, this affects the next frame as a residual image.

Evaluation Results of Example 1 and Comparative Example 1

The evaluation results are shown in FIG. 6. In the case of Comparative Example 1 (main dopant: B), the current ratio of before and after the light irradiation was greater than in Example 1 (main dopant: Ga) at any oxygen concentration [Oi], and it is revealed that the residual image characteristics are inferior. Specifically, the current ratio before and after the light irradiation was 2.7 to 5.2 in Comparative Example 1, and 1.2 to 1.6 in Example 1. When annealing is performed at 450° C. for 75 hours, the current value changes in Comparative Example 1 with a B-doped crystal that generates $BO_2$ defects, but in Example 1 with a Ga-doped crystal, formation of $BO_2$ is suppressed, and therefore, change in current value (change in residual image characteristics) is suppressed. In addition, in Comparative Example 1, current ratio increased as oxygen concentration increased, and it is revealed that there is a tendency that residual image characteristics become degraded as oxygen concentration increases.

On the other hand, in Example 1, the current ratio before and after the light irradiation was an almost constant low value (a value near 1) even when the oxygen concentration increased, and it can be judged that the residual image characteristics were favorable.

Example 2

Using the apparatus in FIG. 2, a CZ silicon single crystal was pulled, and then sliced to fabricate a p-type silicon single crystal substrate for a solid-state image sensor of the present invention having a main dopant of Ga. On fabrication, the specific parameters were as follows. Note that besides Ga, a minute amount of B was intentionally doped on fabrication.

Diameter: 300 mm, crystal orientation: <100>, oxygen concentration: 5 ppma, resistivity: 4 Ωcm, Ga concentration: $3 \times 10^{15}$ atoms/cm$^3$, B concentration: $5 \times 10^{14}$ atoms/cm$^3$ The residual image characteristics were then evaluated in the same manner as in Example 1.

Evaluation Result of Example 2

The current ratio before and after the light irradiation was approximately 1.6, and the residual image characteristics can be judged to be favorable.

Example 3

To fabricate the inventive silicon epitaxial wafer for a solid-state image sensor, firstly, using the apparatus in FIG. 2, a CZ silicon single crystal was pulled, and then sliced to fabricate a p-type silicon single crystal substrate having a main dopant of Ga. On this substrate, a p-type epitaxial layer whose main dopant was Ga was formed. On fabrication, the specific parameters were as follows.
(Silicon Single Crystal Substrate)

Diameter: 300 mm, crystal orientation: <100>, oxygen concentration: 15 ppma, resistivity: 4 Ωcm, Ga concentration: $3 \times 10^{15}$ atoms/cm$^3$, B concentration: $5 \times 10^{13}$ atoms/cm$^3$ or less (the lower limit value in SIMS or less)
(Silicon Epitaxial Layer)

Epitaxial layer thickness: 5 μm, resistivity: 10 Ωcm, Ga concentration: $1 \times 10^{15}$ atoms/cm$^3$, B concentration: $5 \times 10^{13}$ atoms/cm$^3$ or less (the lower limit value in SIMS or less)

The residual image characteristics were then evaluated in the same manner as in Example 1.

Evaluation Result of Example 3

The current ratio before and after the light irradiation was approximately 1.8, and the residual image characteristics can be judged to be favorable.

Comparative Example 2

A silicon epitaxial wafer was fabricated under the same conditions as in Example 3 except that B was used (B concentration in the epitaxial layer: $1 \times 10^{15}$ atoms/cm$^3$) instead of Ga as the dopant of the silicon epitaxial layer, and the residual image characteristics were evaluated in the same manner as in Example 1.

Evaluation Result of Comparative Example 2

The current ratio before and after the light irradiation was approximately 8.2, which is greater than in Example 3, and it is revealed that the residual image characteristics are inferior.

Example 4

To fabricate the inventive silicon epitaxial wafer for a solid-state image sensor, firstly, using the apparatus in FIG. 2, a CZ silicon single crystal was pulled, and then sliced to fabricate a p$^+$-type silicon single crystal substrate having a main dopant of B. On this substrate, a p-type epitaxial layer whose main dopant was Ga was formed. On fabrication, the specific parameters were as follows.
(Silicon Single Crystal Substrate)

Diameter: 300 mm, crystal orientation: <100>, oxygen concentration: 10 ppma, resistivity: 0.01 Ωcm, B concentration: $8.5 \times 10^{18}$ atoms/cm$^3$
(Silicon Epitaxial Layer)

Epitaxial layer thickness: 5 μm, resistivity: 10 Ωcm, Ga concentration: $1 \times 10^{15}$ atoms/cm$^3$, B concentration: $5 \times 10^{13}$ atoms/cm$^3$ or less (the lower limit value in SIMS or less)

The residual image characteristics were then evaluated in the same manner as in Example 1.

Evaluation Result of Example 4

The current ratio before and after the light irradiation was approximately 2.1, and the residual image characteristics can be judged to be favorable.

Example 5

To fabricate the inventive silicon epitaxial wafer for a solid-state image sensor, firstly, using the apparatus in FIG. 2, a CZ silicon single crystal was pulled, and then sliced to fabricate a p$^-$-type silicon single crystal substrate having a main dopant of B. On this substrate, a p-type epitaxial layer whose main dopant was Ga was formed. On fabrication, the specific parameters were as follows.
(Silicon Single Crystal Substrate)

Diameter: 300 mm, crystal orientation: <100>, oxygen concentration: 15 ppma, resistivity: 10 Ωcm, B concentration: $1 \times 10^{15}$ atoms/cm$^3$
(Silicon Epitaxial Layer)

Epitaxial layer thickness: 5 μm, resistivity: 10 Ωcm, Ga concentration: $1 \times 10^{15}$ atoms/cm$^3$, B concentration: $5 \times 10^{13}$ atoms/cm$^3$ or less (the lower limit value in SIMS or less)

The residual image characteristics were then evaluated in the same manner as in Example 1.

Evaluation Result of Example 5

The current ratio before and after the light irradiation was approximately 2.2, and the residual image characteristics can be judged to be favorable.

Example 6

To fabricate the inventive silicon epitaxial wafer for a solid-state image sensor, firstly, using the apparatus in FIG. 2, a CZ silicon single crystal was pulled, and then sliced to fabricate a p-type silicon single crystal substrate having a main dopant of Ga. On this substrate, a p-type epitaxial layer whose main dopant was Ga was formed. On fabrication, the specific parameters were as follows. Note that besides Ga, the epitaxial layer was intentionally doped with a minute amount of B on fabrication.
(Silicon Single Crystal Substrate)

Diameter: 300 mm, crystal orientation: <100>, oxygen concentration: 15 ppma, resistivity 4 Ωcm, Ga concentration: $3 \times 10^{15}$ atoms/cm$^3$, B concentration: $5 \times 10^{13}$ atoms/cm$^3$ or less (the lower limit value in SIMS or less)
(Silicon Epitaxial Layer)

Epitaxial layer thickness: 5 μm, resistivity: 8 Ωcm, Ga concentration: $1 \times 10^{15}$ atoms/cm$^3$, B concentration: $5 \times 10^{14}$ atoms/cm$^3$ The residual image characteristics were then evaluated in the same manner as in Example 1.

Evaluation Result of Example 6

The current ratio before and after the light irradiation was approximately 2.3, and the residual image characteristics can be judged to be favorable.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A silicon epitaxial wafer for a solid-state image sensor having a silicon epitaxial layer on a surface of a silicon single crystal substrate, wherein
the silicon epitaxial layer is a p-type epitaxial layer whose main dopant is Ga, and the silicon epitaxial layer has a B concentration of $5 \times 10^{14}$ atoms/cm$^3$ or less.

2. The silicon epitaxial wafer for a solid-state image sensor according to claim 1, wherein the silicon single crystal substrate is a p-type silicon single crystal substrate whose main dopant is Ga, and the silicon single crystal substrate has a B concentration of $5 \times 10^{14}$ atoms/cm$^3$ or less.

3. A solid-state image sensor having a photodiode unit, a memory unit, and a calculation unit, wherein
at least the photodiode unit is formed on the silicon epitaxial layer of the silicon epitaxial wafer for a solid-state image sensor according to claim 2.

4. The silicon epitaxial wafer for a solid-state image sensor according to claim 1, wherein the silicon single crystal substrate is a p$^+$-type silicon single crystal substrate whose main dopant is B where a B concentration is $1 \times 10^{18}$ atoms/cm$^3$ or more.

5. A solid-state image sensor having a photodiode unit, a memory unit, and a calculation unit, wherein
at least the photodiode unit is formed on the silicon epitaxial layer of the silicon epitaxial wafer for a solid-state image sensor according to claim 4.

6. The silicon epitaxial wafer for a solid-state image sensor according to claim 1, wherein the silicon single crystal substrate is a p$^-$-type silicon single crystal substrate whose main dopant is B where a B concentration is $1 \times 10^{16}$ atoms/cm$^3$ or less.

7. A solid-state image sensor having a photodiode unit, a memory unit, and a calculation unit, wherein
at least the photodiode unit is formed on the silicon epitaxial layer of the silicon epitaxial wafer for a solid-state image sensor according to claim 6.

8. The silicon epitaxial wafer for a solid-state image sensor according to claim 1, wherein the silicon single crystal substrate is an n-type silicon single crystal substrate.

9. A solid-state image sensor having a photodiode unit, a memory unit, and a calculation unit, wherein
at least the photodiode unit is formed on the silicon epitaxial layer of the silicon epitaxial wafer for a solid-state image sensor according to claim 8.

10. A solid-state image sensor having a photodiode unit, a memory unit, and a calculation unit, wherein
at least the photodiode unit is formed on the silicon epitaxial layer of the silicon epitaxial wafer for a solid-state image sensor according to claim 1.

* * * * *